United States Patent [19]

Ichikawa et al.

[11] Patent Number: 5,304,826
[45] Date of Patent: Apr. 19, 1994

[54] SEMICONDUCTOR INTEGRATED CIRCUIT DEVICE

[75] Inventors: Yoshihiro Ichikawa; Seiji Watanabe, both of Yokohama; Takashi Saigo, Ebina; Tsutomu Umetsu, Yokohama, all of Japan

[73] Assignee: Kabushiki Kaisha Toshiba, Kawasaki, Japan

[21] Appl. No.: 951,336

[22] Filed: Sep. 25, 1992

Related U.S. Application Data

[63] Continuation of Ser. No. 762,178, Sep. 20, 1991, abandoned, which is a continuation of Ser. No. 585,680, Sep. 20, 1990, abandoned.

[30] Foreign Application Priority Data

Sep. 22, 1989 [JP] Japan .................... 1-245296
Nov. 22, 1989 [JP] Japan .................... 1-303805

[51] Int. Cl.⁵ .................. H01L 27/10; H01L 27/15
[52] U.S. Cl. .................... 257/202; 257/532; 307/270
[58] Field of Search ............ 357/45 M, 45; 307/270, 307/303, 303.1; 257/202, 532, 296

[56] References Cited

U.S. PATENT DOCUMENTS 4,851,717  7/1989  Yabe ....................... 357/45
4,883,980  11/1989 Morimoto et al. ............ 357/45
5,012,427  4/1991  Kuribayashi .

FOREIGN PATENT DOCUMENTS 0181059   5/1986  European Pat. Off. .
304930A   3/1989  European Pat. Off. ......... 357/45
61-24250  2/1986  Japan .................. 357/45 M
5911670   1/1987  Japan .................. 357/45 M
62-71250  4/1987  Japan .................. 357/45
1196137   8/1989  Japan .

OTHER PUBLICATIONS

"Design and Analysis of a Hierarchical Clock Distribution System for Synchronous Standard Cell/Macrocell VLSI," IEEE Journal of Solid State Circuits SC-21 (1986) Apr., No. 2, Friedman et al.

Primary Examiner—William L. Sikes
Assistant Examiner—Hung Xuan Dang
Attorney, Agent, or Firm—Finnegan, Henderson, Farabow, Garrett & Dunner

[57] ABSTRACT

In a semiconductor integrated circuit device comprising a plurality of cell rows each of which include a plurality of standard cells and a signal amplifier, the amplifier in the respective signal amplifying cells has a drive ability determined according to the load capacity in the corresponding cell row.

16 Claims, 7 Drawing Sheets

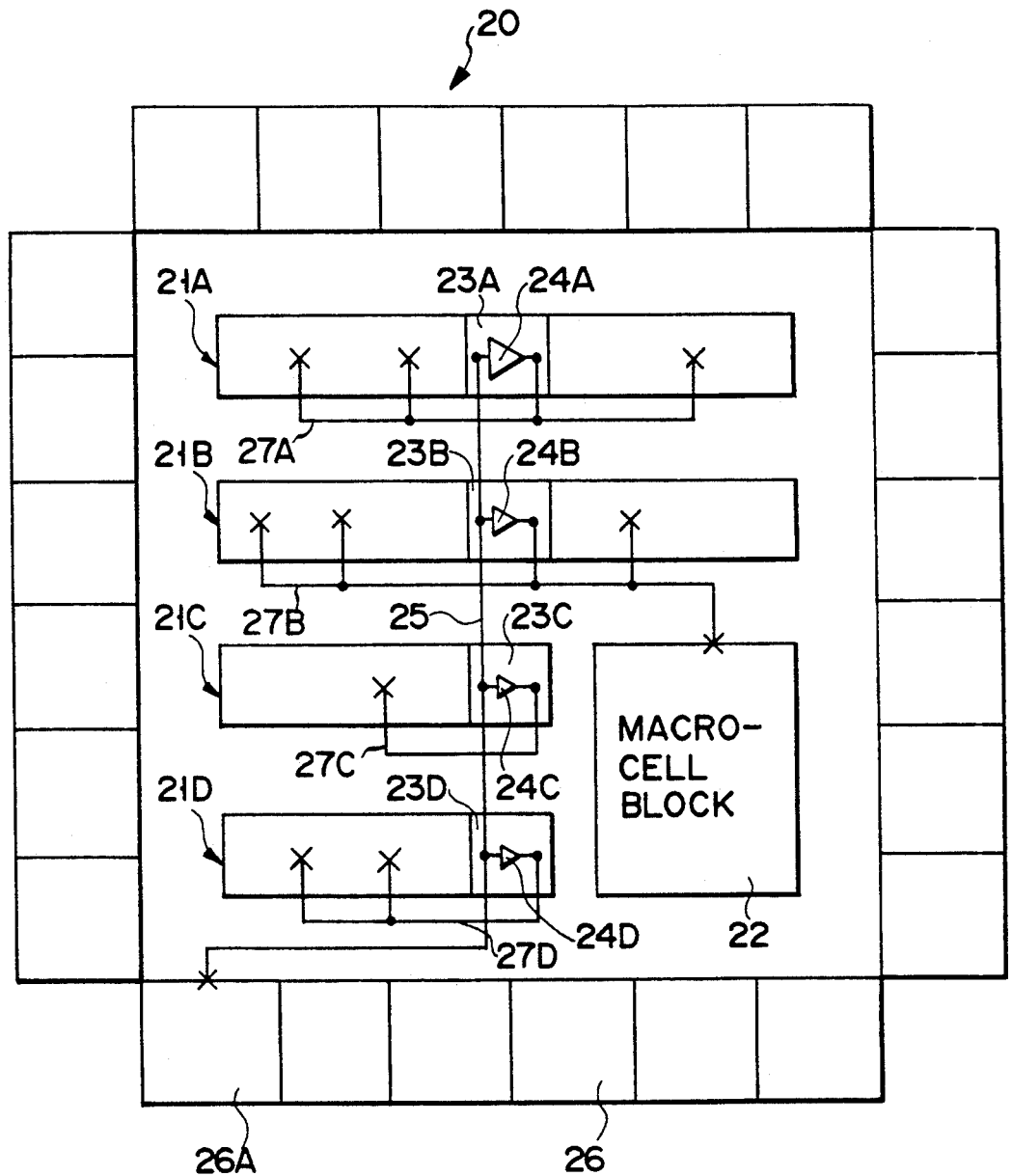
F I G. 2

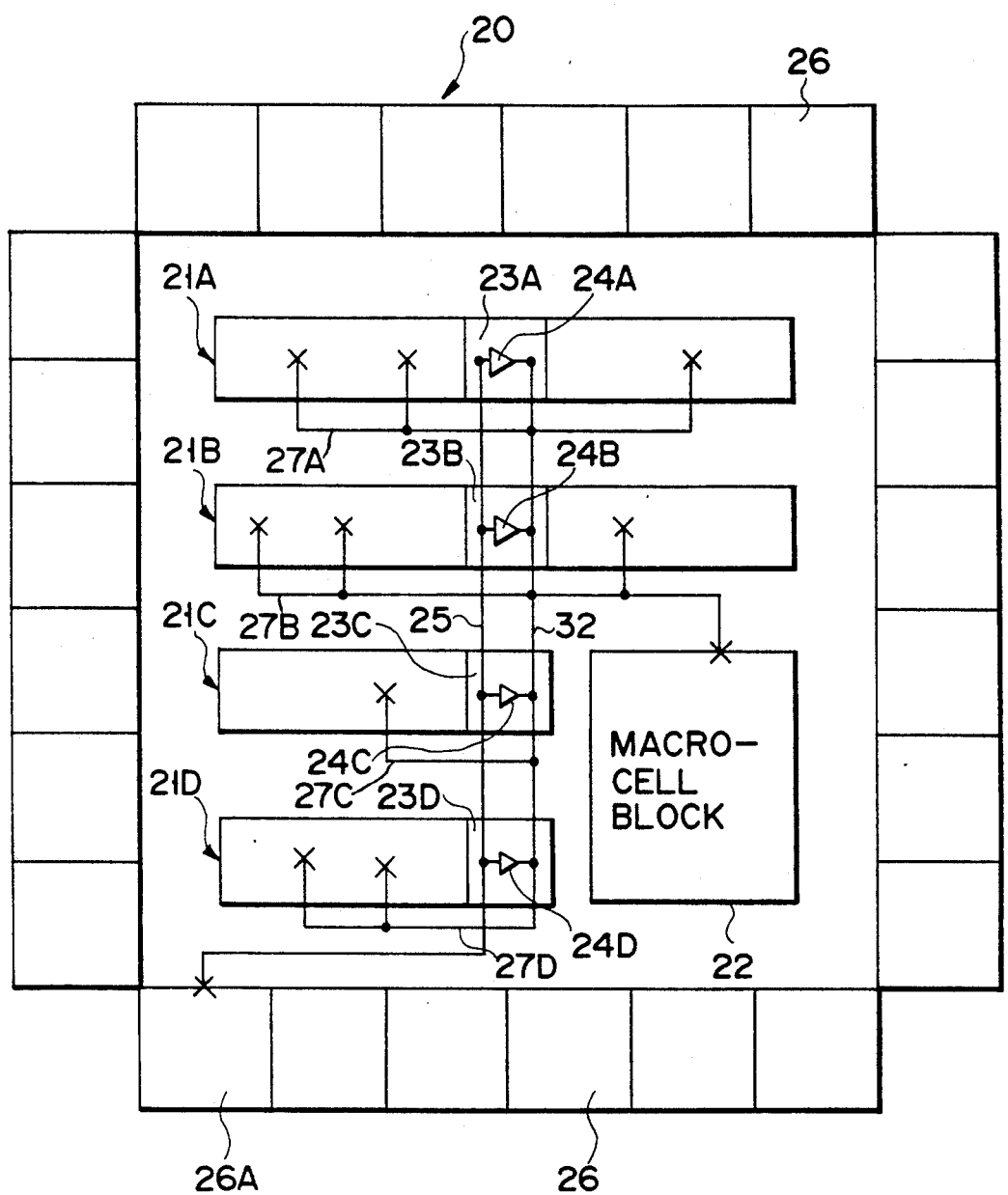
F I G. 3

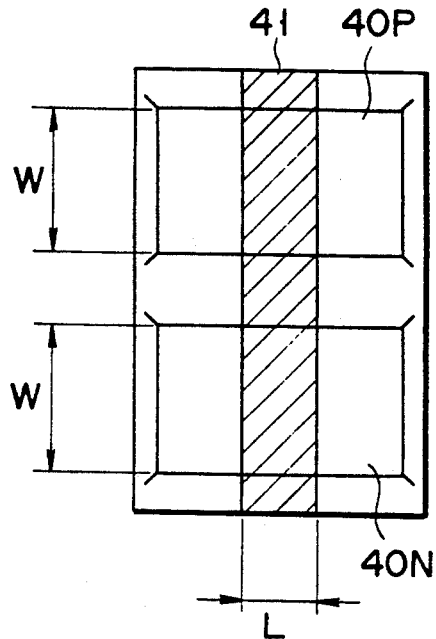
F I G. 5
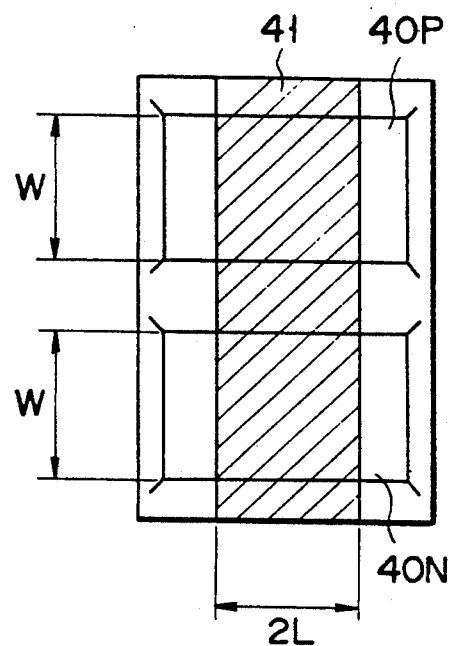
F I G. 6
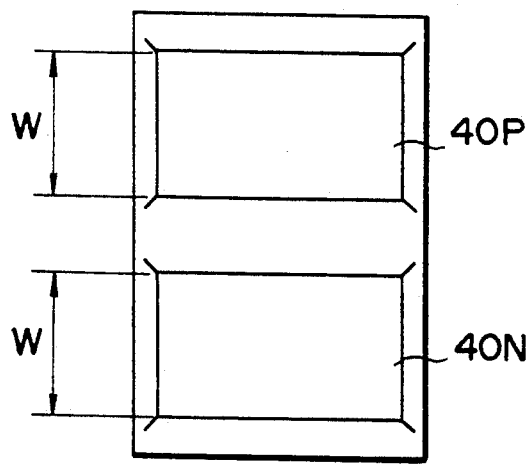
F I G. 7

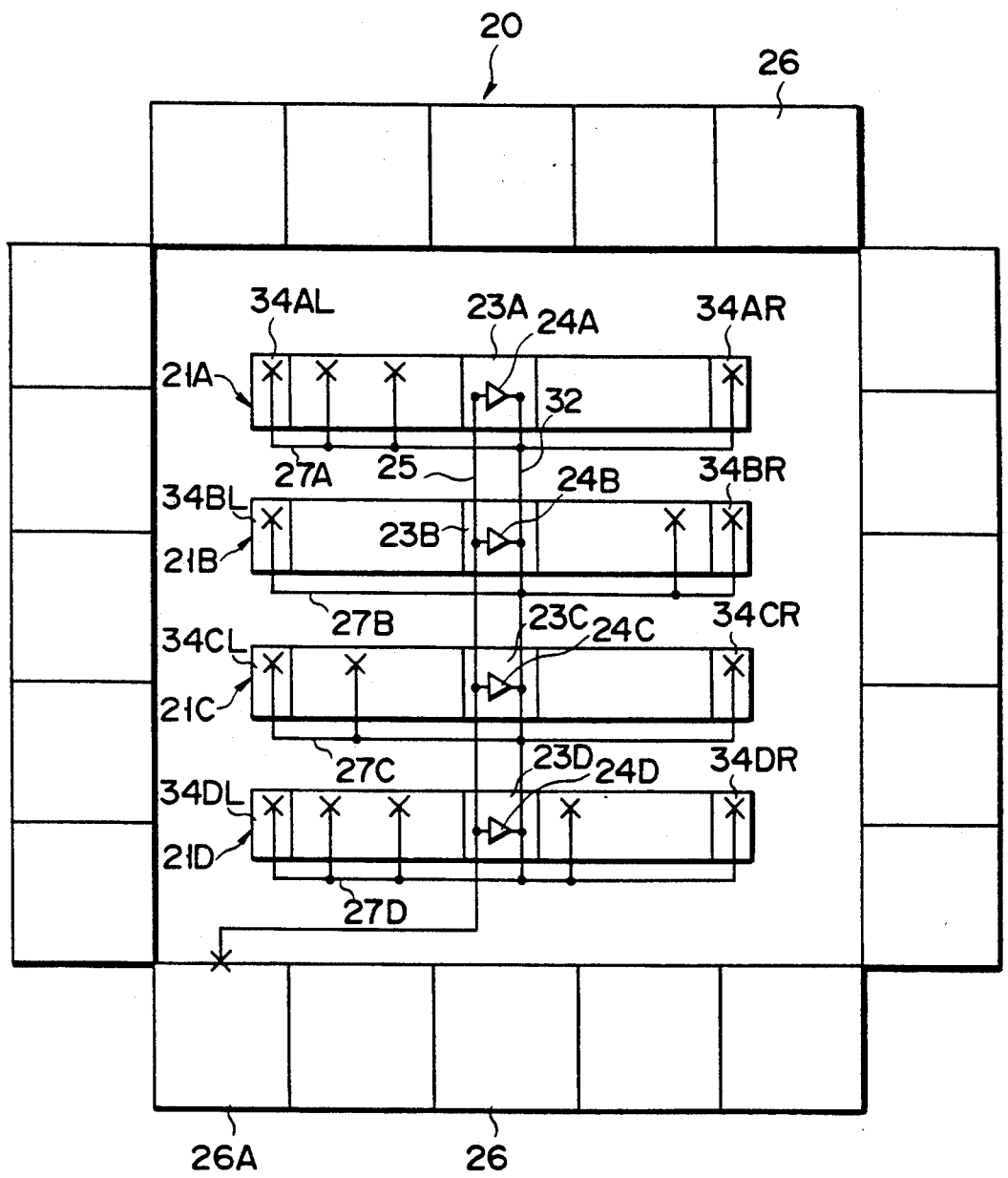
F I G. 9

SEMICONDUCTOR INTEGRATED CIRCUIT DEVICE

This application is a continuation, of application Ser. No. 07/762,178, filed Sep. 20, 1991, now abandoned, which is a continuation of Ser. No. 07/585,680, filed Sep. 20, 1990 now abandoned.

BACKGROUND OF THE INVENTION

1. Field of the Invention

The present invention relates to a semiconductor integrated circuit device and, more particularly, to the elimination of a variation between cell rows with respect to the load capacity of each cell in a semiconductor integrated circuit device.

2. Description of the Related Art

A prior art example of a semiconductor integrated circuit having a plurality of cell rows is shown in FIG. 1.

In FIG. 1, the numeral 10 indicates a chip body, 11A through 11D cell rows each comprising a plurality of standard cells, 12 microcell block, 13A through 13D signal amplifying cells provided in respective cell rows 11A through 11D and located in a line in the direction perpendicular to the cell rows, that is, in the vertical direction on the figure. 14A through 14D are signal amplifiers provided in respective signal amplifying cells 13A through 13D, and 15 is a cell-column wiring layer which is thicker in width than a standard wiring layer formed in the circuit, and which interconnects the inputs of the signal amplifying cells 13A through 13D of the cell rows 11A through 11D.

Numeral 16 indicates I/O (input/output) cells located on the periphery of the chip body, and 16A a clock driver cell acting as an input of a clock signal. The clock signal amplified by the cell 16A is supplied to the inputs of the signal amplifiers 14A through 14D of the signal amplifying cells 13A through 13D.

Outputs of the signal amplifying cells 13A through 13D, that is, outputs of the signal amplifiers 14A through 14D, are connected via respective cell-row wiring layers 17A through 17D to a circuit (not shown), for example, a flip flop circuit, in a standard cell (not shown) in the respective cell rows 11A through 11D. The cell-row wiring layers are of a width of the standard wiring layer formed in the circuit.

In the semiconductor integrated circuit device described above, there is a variation between cell rows 11A through 11D with respect to the load capacity (marked with "x" in FIG. 1) of each cell row. The load capacity marked with "x" corresponds to the gate capacity of, for example, a flip flop circuit (not shown) in the standard cell. There is also a variation between the cell rows with respect to the length of the cell-row wiring layer. These variations cause a clock skew in which the output clock signals of the signal amplifying cells in the cell rows have a phase difference between the cell rows 11A through 11D. A smaller clock skew is preferable. However, the clock skew increases by increased size of circuit, increased load capacity, its variation and the like.

SUMMARY OF THE INVENTION

The object of the present invention is to provide a semiconductor integrated circuit device having a reduced clock skew by eliminating the output phase difference between the cell rows, of the signal amplifying cell.

According to the present invention, there is provided:

a semiconductor integrated circuit device comprising:

a plurality of signal amplifying cells each including a signal amplifier, which are located on a plurality of cell rows;

a cell-row wiring layer provided for each of the cell rows, for supplying the signal amplified by the corresponding signal amplifying cell to a cell in the corresponding cell row; and a cell-column wiring for interconnecting the inputs of the signal amplifying cells of the cell rows, in which the amplifier in the respective signal amplifying cells has a drive ability determined according to the load capacity in the corresponding cell row.

The circuit device of the present invention suppresses a signal phase difference at the outputs of the signal amplifying cells in the cell rows in such a manner that the drive abilities of the signal amplifiers in the signal amplifying cells of the cell rows are determined based on the load capacities of the cell rows, and the width of the cell-column wiring layer for interconnecting the input terminals of the signal amplifying cells of the cell rows is set in a value determined based on the circuit size, the load capacity variation, and the like.

The present invention can further suppress the phase difference at the outputs by interconnecting the output terminals of the signal amplifying cells in the cell rows. By means of a wiring layer having a width determined based on the circuit size, the load capacity variation, and the like.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a pattern top view of an embodiment of a semiconductor integrated circuit device according to the present invention;

FIG. 3 is a pattern top view of another embodiment according to the present invention;

FIG. 5 is a pattern plan view showing a structure of the adjusting cell having load capacity [1];

FIG. 6 is a pattern plan view showing a structure of the adjusting cell having load capacity [2], in which the gate length is 2L and the gate width is W;

FIG. 7 is a pattern plan view showing a structure of the adjusting cell having load capacity [0], in which the gate width is W, and a gate electrode is not provided and thus the gate length is 0;

FIG. 9 is a pattern plan view showing a semiconductor integrated circuit device of a further embodiment according to the present invention.

DETAILED DESCRIPTION OF THE PREFERRED EMBODIMENTS

Figure 1:
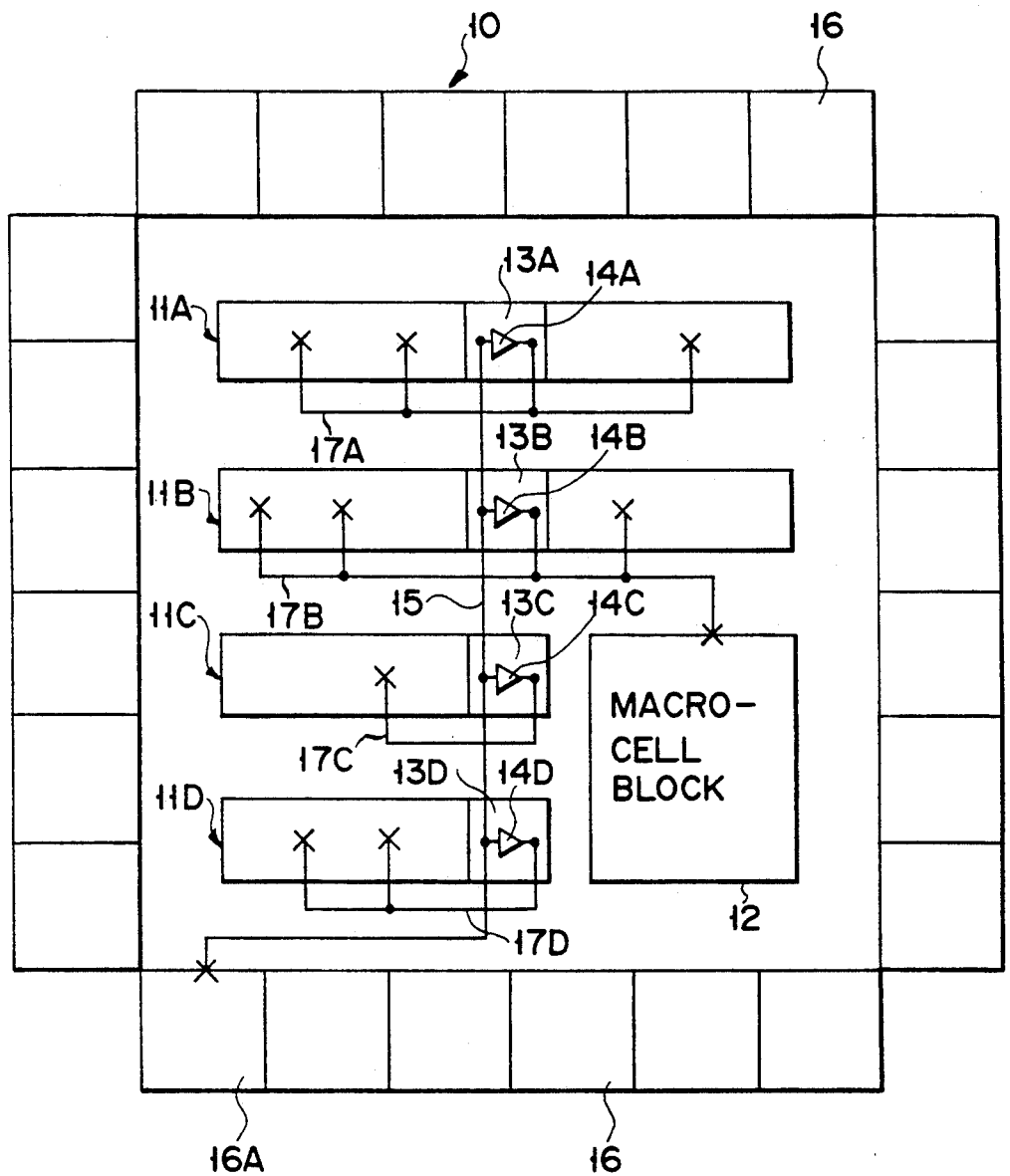
FIG. 1 is a pattern top view of a prior art semiconductor integrated circuit device.

With reference to drawings, an embodiment of a semiconductor integrated circuit device according to the present invention will be explained hereinafter. FIG. 2 is a pattern top view of an embodiment of a semiconductor integrated circuit device.

In FIG. 2, the numeral 20 indicates a chip body, 21A through 21D respective cell rows each comprising a plurality of standard cells, 22 a microcell block, 23A through 23D respective signal amplifying cells provided in respective cell rows 21A through 21D and located in a line in the direction perpendicular to the cell rows, that is, in the vertical direction on the figure, 24A through 24D respective signal amplifiers provided in the signal amplifying cells 23A through 23D, and 25 a cell-column wiring layer which interconnects the inputs of the signal amplifying cells 23A through 23D of the cell rows 21A through 21D.

The cell-column wiring layer 25 has a width determined with respect to the size of the circuit device and the load capacity (marked with x in the figure) of each cell row. For example, where the number of cell rows increases with an increase of the size of circuit, the resistance of the cell-column wiring increases and, thus, time delay in signal transmission increases. In order to suppress such increase, the width of the cell-column wiring layer is set to be larger, thereby allowing wiring resistance to be reduced.

The placement of the signal amplifying cells 23A through 23D in a line in the vertical direction is because that such placement causes the cell-column wiring layer 25 to become the minimum length and the impedance to be the minimum value.

Numeral 26 indicates I/O (input/output) cells located on the periphery of the chip body, and 26A a clock driver cell acting as an input of a clock signal. The clock signal amplified by the cell 26A is supplied to the inputs of the signal amplifiers 24A through 24D of the signal amplifying cells 23A through 23D.

Outputs of the signal amplifying cells 23A through 23D, that is, outputs of the signal amplifiers 24A through 24D, are connected via the respective cell-row wiring layers 27A through 27D to a circuit (not shown), for example, a flip flop circuit, of a standard cell in the respective cell rows 21A through 21D. The cell-row wiring layers are of a width of the standard wiring layer formed in the circuit.

In the device of FIG. 2, assuming that the load capacity in the cell 21C is [1], the load capacity in the cell 21D becomes two-fold [2], the load capacity in the cell 21A becomes three-fold [3], and the load capacity in the cell 21B becomes four-fold [4]. That is, the number of [x] in FIG. 2 represents that of load capacity. In this case, the drive ability of the amplifier 24C in the cell row 21C is set in [1], the drive ability of the signal amplifier 24D in the cell row 21D having two-fold load capacity [2] is set in two-fold [2], the drive ability of the signal amplifier 24A in the cell row 21A having three-fold load capacity [3] is set is three-fold [3], and the drive ability of the signal amplifier 24B in the cell row 21B having four-fold load capacity [4] is set in four-fold [4].

Where the variation of load capacity between cell rows are not in an integer ratio, for example, the load capacity of the cell row 21A is [2.5], the drive ability of the amplifier 24D is set in [2] or the drive ability of the amplifier 24A is set in [3].

FIG. 3 is a pattern top view of another embodiment of a semiconductor integrated circuit device according to the present invention.

In the embodiment, a cell-column wiring layer 32 is included, which interconnects the outputs of the signal amplification cells 24A through 24D in the cell rows 21A through 21D. Other structure is substantially the same as that of the embodiment shown in FIG. 2, thus the descriptions thereof being omitted. Same portions or parts are denoted by the same reference numerals.

The selection of the width of the wiring layer 32 compensates for the unbalance, between the cell rows, in load capacity (marked with x mark) and in drive ability. The width of the wiring layer 32 is determined with respect to an increase of circuit size, a variation of load capacity between cell rows and the like.

There will be described a semiconductor integrated circuit device of a further embodiment according to the present invention, with reference to FIG. 4.

Figure 4:
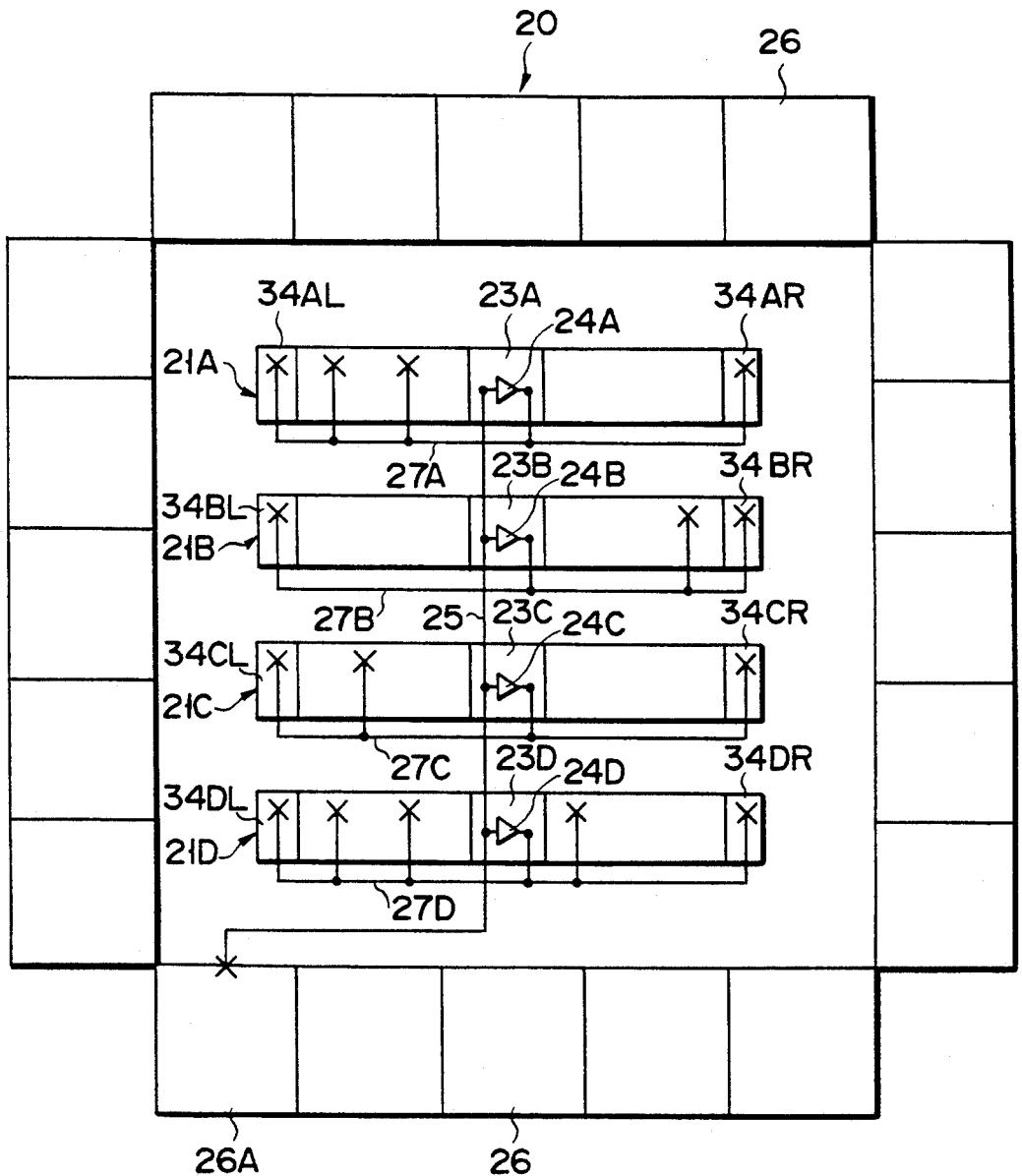
FIG. 4 is a pattern plan view showing a semiconductor integrated circuit device of a further embodiment according to the present invention.

FIG. 4 is a pattern plan view showing a semiconductor integrated circuit device of the further embodiment according to the present invention.

In the circuit device of FIG. 4, further cells 34AR through 34DR and 34AL through 34DL for adjusting the load capacity are provided, the cell-column wiring layer 25 is made wider to reduce the resistance thereof to the extent that the resistance is negligible for time delay of signal transmission, and the amplifiers have the same drive ability. Other structure is substantially the same as that in the previous embodiments, thus the descriptions thereof being omitted. Same portions or parts are denoted by the same reference numerals. Macrocell block is omitted in FIG. 4 and the later described embodiments, for simplicity.

The adjusting cells 34AL and 34AR are provided on the left half portion and the right half portion of the cell rows 21A, respectively. The adjusting cells 34BL and 34BR are provided on the left half portion and the right half portion of the cell rows 21B, respectively. The adjusting cells 34CL and 34CR are provided on the left half portion and the right half portion of the cell rows 21C, respectively. Similarly, the adjusting cells 34DL and 34DR are provided on the left half portion and the right half portion of the cell rows 21D, respectively.

The adjusting cells 34AL and 34AR are connected to the output terminal of the amplifier 24A of the cell row 21A via cell-row wiring layer 27A. The adjusting cells 34BL and 34BR are connected to the output terminal of the amplifier 24B of the cell row 21B via cell-row wiring layer 27B. The adjusting cells 34CL and 34CR are connected to the output terminal of the amplifier 24C of the cell row 21C via cell-row wiring layer 27C. Similarly, the adjusting cells 34DL and 34DR are connected to the output terminal of the amplifier 24D of the cell row 21D via cell-row wiring layer 27D.

These adjusting cells are used to equalize the capacities of the cell rows 21A through 21D so that the load capacities of the amplifiers 24A through 24D are equal to each other. By doing so, the phase difference of the clock signals at the output terminals of the amplifiers 24A through 24D are significantly suppressed and, the clock skew problem is virtually eliminated.

These adjusting cells are constituted in such a manner that they have a unit capacity or several times the unit capacity, so that the designing of the semiconductor circuit device may be simplified.

There will now be described a method to equalize the load capacities of the cell rows by means of the adjusting cells.

In the right half portions of the cell rows of the circuit device shown in FIG. 4, the cell rows 21B and 21D have the load capacity [1], and cell rows 21A and 21C have no load capacity. Thus, adjusting cells having the load capacity [1] are used as the adjusting cells 34AR and 34CR. On the other hand, adjusting cells having the load capacity [0] are used as the adjusting cells 34BR and 34DR. In this way, the load capacity of the right half portions of the cell rows are equalized to load capacity [1].

In the left half portions of the cell rows of the circuit device shown in FIG. 4, the cell rows 21A and 21D have the load capacity [2], the cell row 21C has the load capacity [1], and cell row 21B has no load capacity. Thus, an adjusting cell having the load capacity [2] is used as the adjusting cells 34BL, and an adjusting cell having the load capacity [1] is used as the adjusting cell 34CL. On the other hand, adjusting cells having the load capacity [0] are used as the adjusting cells 34AL and 34DL. In this way, the load capacity of the left half portions of the cell rows are equalized to load capacity [2].

As a result, the load capacities of the cell rows are equalized to [3] and, thus the phase difference of the clock signals at the output terminal of the amplifiers is effectively suppressed.

When the adjusting cells are positioned at the end portions of the cell rows, as shown in FIG. 4, the lengths of the cell rows are the same and, thus, the capacities corresponding to the lengths of the wiring layers are the same. The cells having load capacity [0] areas inserted into the circuit device in order to extend the cell-row wiring layer to the ends of the cell rows.

There will now be described structures of the adjusting cells with reference to FIGS. 5 through 7.

FIG. 5 is a pattern plan view showing a structure of the adjusting cell having load capacity [1].

As shown in FIG. 5, the adjusting cell comprises a P channel MOS transistor 40P and an N channel MOS transistor 40N. A gate electrode 41 extends over these MOS transistors. The structure of the adjusting cell may be substantially the same as that of the input gate of a standard cell (not shown), for example, a flip flop circuit, connected to the cell-row wiring layers. By doing so, the gate capacity of the adjusting cell equals to the gate capacity of the flip flop circuit, and the adjusting cell functions as a load capacity corresponding to the gate capacity of the flip flop circuit, when the adjusting cell is used in the cell rows.

For example, when a CMOS inverter whose gate length is L and whose gate width is W is used as an input gate of a flip flop circuit, a load capacity adjusting cell shown in FIG. 5 whose gate length is L and whose gate width is W is used, so that the gate capacitance of the flip flop circuit equals to the gate capacitance of the adjusting cell.

FIG. 6 is a pattern plan view showing a structure of the adjusting cell having load capacity [2], in which the gate length is 2L and the gate width is W.

FIG. 7 is a pattern plan view showing a structure of the adjusting cell having load capacity [0], in which the gate width is W, and a gate electrode is not provided and thus the gate length is 0.

In the embodiment shown in FIG. 4, the adjusting cells are positioned at the ends of the row cells. However, the positioning of the adjusting cells is not limited thereto. For example, as shown in FIG. 8 which shows a pattern plan view showing a semiconductor integrated circuit device of a further embodiment according to the present invention, the adjusting cells may be positioned in the midst of the cell rows.

Figure 8:
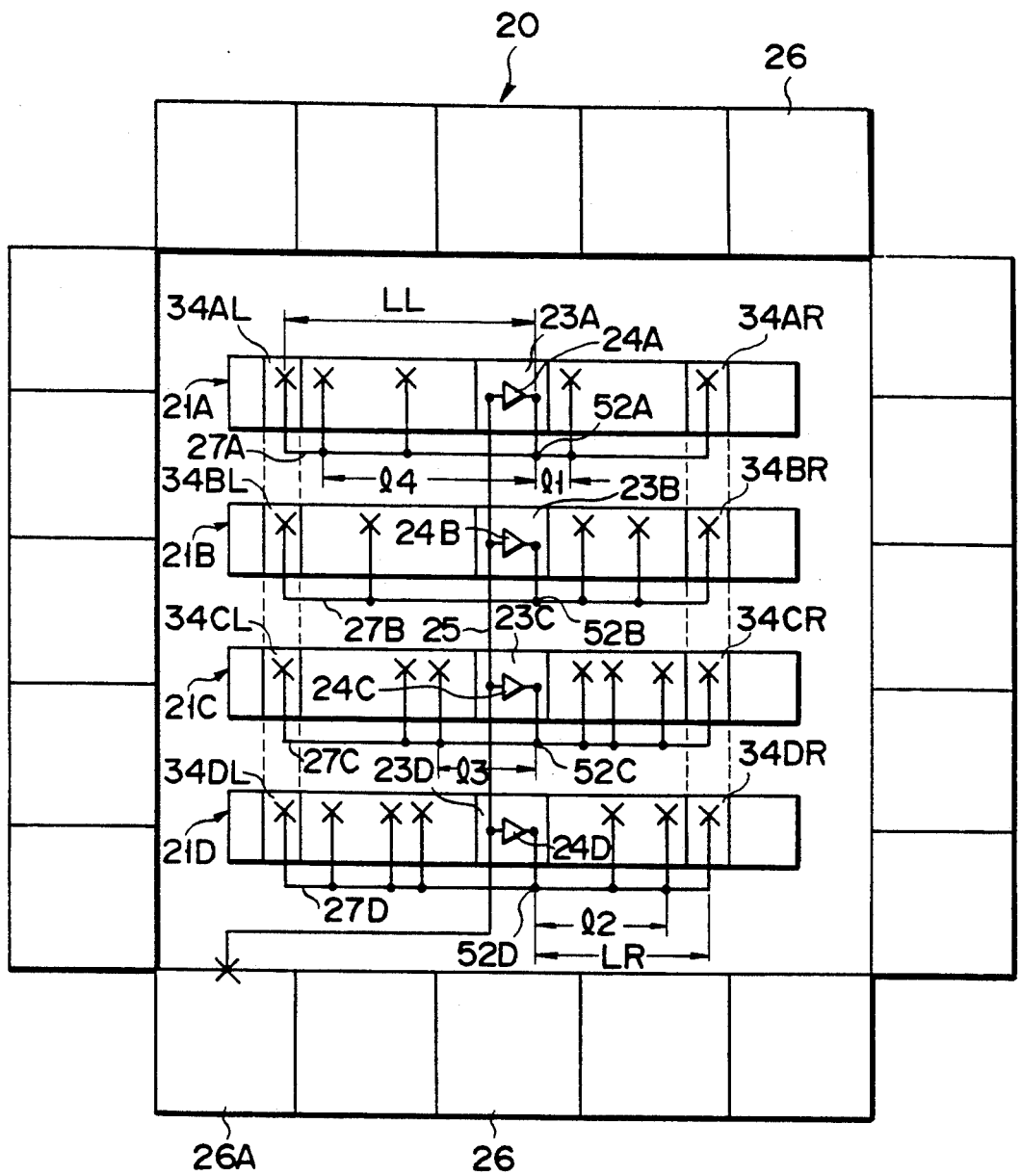
FIG. 8 is a pattern plan view showing a semiconductor integrated circuit device of a further embodiment according to the present invention.

In the right half portion of the circuit device shown in FIG. 8, among the cell rows, the cell rows 21A has a standard cell which is nearest to the connecting portion 52A, and the cell row 21D has a standard cell which is farthest from the connecting portion 52D. The nearest standard cell is away from the connecting portion 52A by distance l1. The farthest standard cell is away from the connecting portion 52D by distance l2. The adjusting cell 34DR is positioned outside the farthest standard cell in the cell row 21D. The distance between the connecting portion 52D and the adjusting cell 34DR is LR. Other adjusting cells 34AR through 34CR are positioned at the portions in the cell rows, which corresponds to the position where the adjusting cell 34DR is provided in the cell row 21D. In this way, all the adjusting cells 34AR through 34DR are positioned at the respective positions which are far by distance LR from the respective connecting portions 52A through 52D of the amplifiers 24A through 24D with the cell-row wiring layers 27A through 27D in the cell rows 21A through 21D.

In the left half portion of the circuit device shown in FIG. 8, among the cell rows, the cell row 21C has a standard cell which is nearest to the connecting portion 52C, and the cell row 21A has a standard cell which is farthest from the connecting portion 52A. The nearest standard cell is among from the connecting portion 52C by distance l3. The farthest standard cell is away from the connecting portion 52A by distance l4. The adjusting cell 34CL is positioned outside the furthest standard cell in the cell row 21C. The distance between the connecting portion 52C and the adjusting cell 34CL is LL. Other adjusting cells 34AL, 34BL, and 34DL are positioned at the portions in the cell rows, which corresponds to the position where the adjusting cell 34CL is provided in the cell row 21C. In this way, all the adjusting cells 34AL through 34DL are positioned at the respective positions which are separated by distance LL from the respective connecting portions 52A through 52D of the amplifiers 24A through 24D with the cell-row wiring layers 27A through 27D in the cell rows 21A through 21D.

FIG. 9 shows a pattern plan view showing a semiconductor integrated circuit device of a yet further embodiment of the present invention.

In the circuit device shown in FIG. 9, the outputs of the amplifiers are interconnected, so that the variation of the capacitance in the amplifiers are canceled to effectively reduce the generation of the phase difference of the clock signal.

Other structure is substantially the same as that in the embodiment shown in FIG. 8, thus the descriptions thereof being omitted. Same portions or parts are denoted by the same reference numerals.

According to the preferred embodiments of the present invention described above, a clock phase difference between the outputs of signal amplifying cells of the cell rows can be suppressed by matching the drive ability of the signal amplification cells in the cell rows with the load capacity of the corresponding cell rows. The clock phase difference is further suppressed by setting the width of the cell-column wiring layer connecting the inputs of the signal amplification cells in the cell rows in a value determined based on the circuit size, the load capacity variation, and the preferred embodiments of the like. According to the present invention, the phase difference is further suppressed by interconnecting the outputs of the signal amplification cells in the cell rows by means of a cell-column wiring layer whose width is determined based on the circuit size, the load capacity variation, and the like. Thus, a clock skew due to an increase of the circuit size, and the load capacity variation can be greatly suppressed.

According to the preferred embodiments of the present invention the clock phase difference can also be suppressed by equalizing the load capacities of the cell rows using a load capacity adjusting cell.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit device comprising:
   a plurality of cell rows, each cell row having a load capacity and including
      a plurality of standard cells, and
      a signal amplifying cell including a signal amplifier having an input, and an output for generating an amplified signal, the signal amplifier being characterized by a drive ability, and
      a cell-row wiring layer, coupled to the signal amplifier output, for supplying the amplified signal to the standard cells; and
   a cell-column wiring layer coupled to a plurality of the signal amplifier inputs,
   wherein the drive ability of each signal amplifier is substantially matched with the corresponding load capacity such that a phase difference among the outputs of the plurality of signal amplifiers is suppressed, the drive ability of the signal amplifier of a first one of the plurality of cell rows is different than the drive ability of the signal amplifier of a second one of the plurality of cell rows, and a plurality of the signal amplifier outputs are interconnected by a cell-column wiring layer.

2. A semiconductor integrated circuit device according to claim 1, in which the signal amplifying cells are located substantially in a column.

3. A semiconductor integrated circuit device according to claim 2, in which the signal amplifier inputs are coupled to clock signals.

4. A semiconductor integrated circuit device according to claim 1, in which the signal amplifier inputs are coupled to clock signals.

5. A semiconductor integrated circuit device according to claim 4, in which a plurality of the signal amplifier outputs are interconnected by a cell-column wiring layer.

6. A semiconductor integrated circuit device according to claim 4, in which a plurality of the signal amplifier inputs are coupled to a common clock signal.

7. A semiconductor integrated circuit device according to claim 1, in which a plurality of the signal amplifier outputs are interconnected by a cell-column wiring layer.

8. A semiconductor integrated circuit device according to claim 1, wherein the signal amplifying cells are located substantially in a column and a plurality of the signal amplifier inputs are coupled to a common clock signal.

9. A semiconductor integrated circuit device according to claim 8, further comprising:
   a cell-column wiring layer for interconnecting inputs of the signal amplifying cells; and
   a cell-column wiring layer for interconnecting outputs of the signal amplifying cells.

10. A semiconductor integrated circuit device according to claim 1, in which a plurality of the signal amplifiers have their inputs coupled to a common clock signal.

11. A semiconductor integrated circuit device comprising:
    a plurality of cell rows, each cell row having a total capacitance and including
       a plurality of standard cells, the plurality of standard cells as a unit having an input load capacitance,
       a load capacitance adjusting cell including a component having an adjusting capacitance for equalizing the total capacitances of the plurality of cell rows,
       a signal amplifying cell including a signal amplifier having an input, an output for generating an amplified signal, and
       a cell-row wiring layer, coupled to the signal amplifier output and to the load capacitance adjusting cell, for supplying the amplified signal to the standard cells and to the load capacitance adjusting cell; and
    a cell-column wiring layer coupled to a plurality of the signal amplifier inputs,
    wherein the adjusting capacitance in a first one of the plurality of cell rows has a first value and the adjusting capacitance of a second one of the plurality of cell rows has a second value different than the first value.

12. A semiconductor integrated circuit device according to claim 11, in which said adjusting cells are located at predetermined areas in the cell rows.

13. A semiconductor integrated circuit device according to claim 11, in which each of the load capacitance adjusting cells is located at an end of the corresponding row.

14. A semiconductor integrated circuit device according to claim 11 wherein, in a plurality of the cell rows, the adjusting cell is located such that a standard cell most remote from the amplifying cell is between the adjusting cell and the amplifying cell.

15. A semiconductor integrated circuit device according to claim 11, wherein the signal amplifying cells are located substantially in a column and a plurality of the signal amplifier inputs are coupled to a common clock signal.

16. A semiconductor integrated circuit device according to claim 11, in which a plurality of the signal amplifiers have their inputs coupled to a common clock signal and the adjusting capacitance is inversely related to the input load capacitance such that a phase difference among the outputs of the plurality of signal amplifiers is suppressed.

* * * * *